(12) United States Patent
Yamada et al.

(10) Patent No.: US 7,102,282 B1
(45) Date of Patent: Sep. 5, 2006

(54) DISPLAY DEVICE WITH A CAVITY STRUCTURE FOR RESONATING LIGHT

(75) Inventors: Jiro Yamada, Kanagawa (JP); Tatsuya Sasaoka, Kanagawa (JP); Takashi Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/889,532

(22) PCT Filed: Nov. 22, 2000

(86) PCT No.: PCT/JP00/08233

§ 371 (c)(1),
(2), (4) Date: Oct. 2, 2001

(87) PCT Pub. No.: WO01/39554

PCT Pub. Date: May 31, 2001

(30) Foreign Application Priority Data

Nov. 22, 1999 (JP) ............................... P11-330805
Aug. 23, 2000 (JP) ............................ P2000-251996

(51) Int. Cl.
*H05B 33/02* (2006.01)

(52) U.S. Cl. ...................................... 313/506; 313/504

(58) Field of Classification Search ................ 313/503, 313/504, 506, 509, 512, 112; 428/690, 917
See application file for complete search history.

(56) References Cited

U.S. PATENT DOCUMENTS 5,936,347 A * 8/1999 Isaka et al. .................. 313/509
5,949,187 A * 9/1999 Xu et al. ..................... 313/504
6,091,197 A * 7/2000 Sun et al. .................... 313/509
6,133,692 A * 10/2000 Xu et al. ..................... 313/506

FOREIGN PATENT DOCUMENTS

| JP | 4-328295 | 11/1992 |
| JP | 5-343183 | 12/1993 |
| JP | 6-275381 | 9/1994 |
| JP | 6-283271 | 10/1994 |
| JP | 7-142171 | 6/1995 |
| JP | 7-240277 | 9/1995 |
| JP | 7-320864 | 12/1995 |

(Continued)

OTHER PUBLICATIONS

Takahiro Nakayama et al., Transactions C-II, *Institute of Electronics, Information and Communication Engineers*, vol. J77-C-II, No. 10, pp. 437-443 (1994).

(Continued)

*Primary Examiner*—Joseph Williams
*Assistant Examiner*—Matt Hodges
(74) *Attorney, Agent, or Firm*—Sonnenschein Nath & Rosenthal LLP

(57) ABSTRACT

In an organic EL device having a first electrode of a light reflective material, organic layer including an organic light emitting layer, semitransparent reflection layer, and second electrode of a transparent material that are stacked sequentially, and so configured that the organic layer functions as a cavity portion of a cavity structure, light that resonates in a certain spectral width (wavelength λ) is extracted by so configuring that optical path length L becomes minimum in a range satisfying $(2L)/\lambda + \Phi/(2\Pi) = m$ (m is an integer) where the phase shift produced in light generated in the organic light emitting layer when reflected by opposite ends of the cavity portion is Φ radians, L is optical path length of the cavity portion, and λ is the peak wavelength of the spectrum of part of light to be extracted.

7 Claims, 17 Drawing Sheets

FOREIGN PATENT DOCUMENTS

JP   8-213174   8/1996
JP   9-180883   7/1997

OTHER PUBLICATIONS

A. Dodabalapur et al., *Applied Physics Letters,* "Microcavity Effects In Organics Semiconductors," vol. 64, No. 19, pp. 2486-2488 (1994).

Kristiaan Neyts et al., *Journal Of The Optical Society of America B,* "Semitransparent Metal Or Distributed Bragg Reflector For Wide-Viewing-Angle Organic Light-Emitting-Diode Microcavities," vol. 17, No. 1 (2000).

A. Dodabalapur et al., *Applied Physics Letters,* "Color Variation With Electroluminescent Organic Semiconductors In Multimode Resonant Cavities," vol. 65, No. 18 pp. 2308-2310 (1994).

* cited by examiner

DISPLAY DEVICE WITH A CAVITY STRUCTURE FOR RESONATING LIGHT

BACKGROUND OF THE INVENTION

1. Field of the Invention

This invention relates to a display device and, more particularly, to a spontaneous emission-type display device such as organic electroluminescense device.

2. Background Art

A device using electroluminescence of an organic material (hereinafter called "organic EL device") is made of an organic layer in which an organic hole transport layer, or organic light emitting layer, interposed between a first electrode and a second electrode. This device is characterized as a spontaneous emission type display device capable of high-luminance emission by low-voltage d.c. driving.

FIG. 1 shows a cross-sectional configuration of a central part of a transmission-type organic EL device as one of such organic EL devices. The organic EL device shown in FIG. 1 is made by stacking on a transparent substrate 1, sequentially from bottom to top, a transparent electrode 2, organic buffer layer 3, organic hole transport layer 4, organic light emitting layer 5 and metal electrode 6, and light h generated in the organic light emitting layer 5 is extracted through the substrate 1.

In the organic EL device shown in FIG. 1, however, spectrums of respective colors in the light h generated in and extracted from the organic light emitting layer 5 having various emission colors have wide peak widths as shown in FIG. 2, and especially regarding the red light h, the peak wavelength is deviated to a lower wavelength. Therefore, with a display apparatus made by using such organic EL devices for color representation, it was impossible to obtain a sufficient color reproduction range enough to display, for example, TV images.

To overcome this problem, it was proposed to interpose a dielectric mirror layer (not shown) between the substrate 1 and the transparent electrode 2 such that the dielectric mirror layer, organic buffer layer e, organic hole transport layer 4, organic light emitting layer 5 and metal electrode 6 form a cavity structure. In the organic EL device having this cavity structure, light h generated in the organic light emitting layer 5 reciprocally moves between the dielectric mirror layer and the metal electrode 6, and only a part of light with the resonant wavelength is extracted through the substrate 1. Therefore, light h having a high peak intensity and a narrow spectrum can be extracted, and it is possible to enlarge the color reproduction range of a display apparatus using such organic EL devices.

However, as the peak width of the spectrum of extracted light h is narrowed, as it is in the organic EL device having the above-mentioned cavity structure, dependency of the emission property on the view angle increases. For example, when the emission surface is viewed from an aslant direction, wavelength of light h largely shifts and the emission intensity decreases. Therefore, it is important that the spectral width of light extracted from the organic EL device is not narrow too much. However, the organic EL device does not envisage the dependency of the view angle in its design, and could not maintain a sufficient color reproduction range over wide view angles.

Moreover, the organic EL device, in problem, had to optimize the cavity structure for light h of each color to be extracted, and required an additional effort for it.

Further, in the organic EL device shown in FIG. 1, because external light intruding from outside the device is reflected by the metal electrode 6, its external light reflectance is high and this results in a low contrast under external light. As a technique for preventing it, Japanese Patent Laid-Open Publication No. hei 9-127885 discloses an organic EL display apparatus having a combination of a ¼ wavelength panel and a linear polarizing panel disposed in front of the front surface, as shown in FIG. 3. More specifically, this organic EL display apparatus locates a combination of a ¼ wavelength panel 8 and a linear polarizing panel 9 in front of a substrate 1 in an organic EL device having the same configuration already explained with reference to FIG. 1 for the purpose of preventing reflection of external light. It is also proposed to replace the metal electrode behaving as a reflective surface with a transparent electrode and providing a light absorbing layer on side of the transparent electrode opposite from the organic layer such that the light absorbing layer absorbs external light and prevents reflection of external light. However, in those display apparatuses having those configurations, extraction and reflection of light generated in the display apparatus are also prevented, and their luminance decreases to about 50%.

It is also proposed to dispose color filters transmitting red (R), green (G) and blue (B) colors, respectively, on respective color emission pixels. Although display devices with this configuration could prevent reflection of external light other than emitted light, they cannot prevent reflection of external light outside the wavelength ranges of the emission colors of respective pixels.

It is therefore an object of the invention to provide a spontaneous emission type display device that can maintain a sufficient color reproduction range over a wide view angle.

Another object of the invention is to provide a spontaneous emission type display device that can reduce reflection of external light and thereby improves the contrast without inviting a decrease in luminance.

A further object of the invention is to provide a spontaneous emission type display device that can maintain a sufficient color reproduction range over a wide view angle and can improve the contrast by reducing reflection of external light without inviting a decrease in luminance.

SUMMARY OF THE INVENTION

To accomplish the above objects, according to the invention, there are provided display devices each including a light emitting layer interposed between a first electrode of a light reflective material and a second electrode of a transparent material such that at least one of the second electrode and the light emitting layer serves as a cavity portion of a cavity structure, in which the cavity portion has any of the configurations shown below.

In the first display device, when the phase shift produced in light generated in the light emitting layer when reflected by opposite ends of the cavity portion is $\Phi$ radians, L is optical path length of the cavity portion, and $\lambda$ is the peak wavelength of the spectrum of part of light to be extracted, optical path length L of the cavity portion takes a positive minimum value in a range satisfying the equation:

$$(2L)/\lambda + \Phi/(2\Pi) = m \text{ (m is an integer)} \quad (1)$$

In the first display device having the above-summarized configuration, since the optical path length L of the cavity portion satisfies Equation (1), multiple interference of light near the wavelength $\lambda$ occurs in the cavity portion. Additionally, since the optical path length L of the cavity portion is controlled to be the positive minimum value in the range satisfying Equation (1), spectrum of the extracted light is maintained in the widest width in the range inducing multiple interference of the light with the wavelength λ. As a result, in the display device, while the spectrum of the extracted light keeps a certain width, the peak intensity is enhanced by multiple interference. Therefore, the display device exhibits only a small shifting amount of the wavelength λ even when viewed from different view angles and provides an improved color purity in a wider view angle range.

In the second display device, when the phase shift produced in light generated in said light emitting layer when reflected by opposite ends of said cavity portion is Φ radians, L' is optical path length of said cavity portion, and λ is the peak wavelength of the spectrum of green light, optical path length L' of said cavity portion is determined to satisfy the following equation (3) which is made by adding 4 to the integer m1 that is one of integers m satisfying the following equation (2), with which L takes a positive minimum value.

$$(2L)/\lambda + \Phi/(2\Pi) = m \text{ (m is an integer)} \quad (2)$$

$$(2L')/\lambda + \Phi/(2\Pi) = m1 + 4 \quad (3)$$

In the second display device having the above-summarized configuration, multiple interference occurs in light with wavelengths corresponding to red (R), green (G) and blue (B) in the cavity portion. As a result, peak intensity of spectrum of each emitted light can be enhanced without setting optical path length L' of the cavity portion specifically for each color. Therefore, a common optical path length L' of the cavity portion can be used in all display devices corresponding to respective emitted colors.

In the third display device, when the phase shift produced in light generated in said light emitting layer when reflected by opposite ends of said cavity portion is Φ radians, L' is optical path length of said cavity portion, and λ is the peak wavelength of the spectrum of green light, optical path length L' of said cavity portion is determined to satisfy the following equation (5) which is made by adding an integer not smaller than 10 to the integer m1 that is one of integers m satisfying the following equation (4), with which L takes a positive minimum value.

$$(2L)/\lambda + \Phi/(2\Pi) = m \text{ (m is an integer)} \quad (4)$$

$$(2L')/\lambda + \Phi/(2\Pi) = m1 + q \quad (5)$$

In this display device, multiple interference occurs among a number of light components with different wavelengths in each of the ranges of red (R), green (G) and blue (B) in the cavity portion. As a result, in a color display apparatus using such display devices, a common optical path length L' of the cavity portion can be used in all display devices corresponding to respective emitted colors. Moreover, since light of each emission color extracted after multiple interference is composed of a plurality of peaks, entire spectral width of extracted light h is virtually wider. Therefore, in this display device, shifting of the wavelength λ is limited to a small value even when viewed from different view angles and the color purity is improved in a wider view angle range.

The fourth display device according to the invention is characterized in that a color filter for transmitting light which resonates in said cavity portion and is to be extracted through said second electrode is provided above said second electrode.

In the display device having the above-summarized configuration, if the wavelength of the light extracted from the second electrode after resonance in the cavity portion is the target wavelength, only a part of external light having the target wavelength, which is contained in the external light irradiated from the second electrode side, can transmit the color filter and reaches the cavity portion. Since the cavity portion used here is a cavity filter for the target wavelength, its transmittance for the target wavelength range is very high. That is, reflectance to light in the target wavelength range is very low. Therefore, this cavity portion prevents reflection of external light passing through the color filter and belonging to the same wavelength range as the target wavelength. On the other hand, external light outside the target wavelength range is prevented from intruding into the device by the color filter and from reflection by the color filter. As a result, reflection of external light containing light within the target wavelength range is prevented without disturbing extraction of the emitted light in the target wavelength range from the second electrode side.

The fifth to seventh display devices are combinations of the first to third display devices with the fourth display device, respectively.

According to further inventions for accomplishing the above objects, there are provided display devices each having a light emitting layer between a first electrode and a second electrode such that at least one of the light emitting layer and one of the first electrode and the second electrode, from which light is extracted, serves as a cavity portion of a cavity structure, and characterized in that the cavity portions have the same configurations as those of the first to seventh display devices.

According to still further inventions for accomplishing the above objects, there are provided display devices each having a first electrode of a light reflective material, light emitting layer and a second electrode of a transparent material which are sequentially stacked on a substrate such that at least one of the second electrode and the light emitting layer serves as a cavity portion of a cavity structure, and characterized in that the cavity portions have the same configurations as those of the first to seventh display devices.

According to yet further inventions for accomplishing the above objects, there are provided display devices each having a first electrode of a light reflective material, light emitting layer and a second electrode of a transparent material which are sequentially stacked on a substrate such that at least one of the second electrode and the light emitting layer serves as a cavity portion of a cavity structure, and characterized in that the cavity portions have the same configurations as those of the first to seventh display devices. Typically, in each of those display devices, the light emitting layer serves as the cavity portion of the cavity structure, or the second electrode serves as the cavity portion of the cavity structure.

According to a yet further invention for accomplishing the above objects, there is provided a display device having a light emitting layer interposed between a first electrode of a light reflective material and a second electrode of a transparent material and so configured that at least one of said second electrode and said light emitting layer serves as a cavity portion of a cavity structure, characterized in that, when optical path length of said cavity portion is L, said optical path length L is determined so determined that difference between the peak wavelength of the spectrum of light to be extracted upon a change in view angle and the peak wavelength of the internal emission spectrum (for example, spectrum of light generated in the organic light emitting layer 13c in embodiments described later and extracted directly not through multiple interference) is limited within one half of the half-width (FWHM) of said internal emission spectrum.

DETAILED DESCRIPTION OF THE PREFERRED EMBODIMENTS

Explained below are some embodiments of the invention with reference to the drawings. Here are explained embodiments of display device as applying the invention to organic EL devices.

Figure 4:
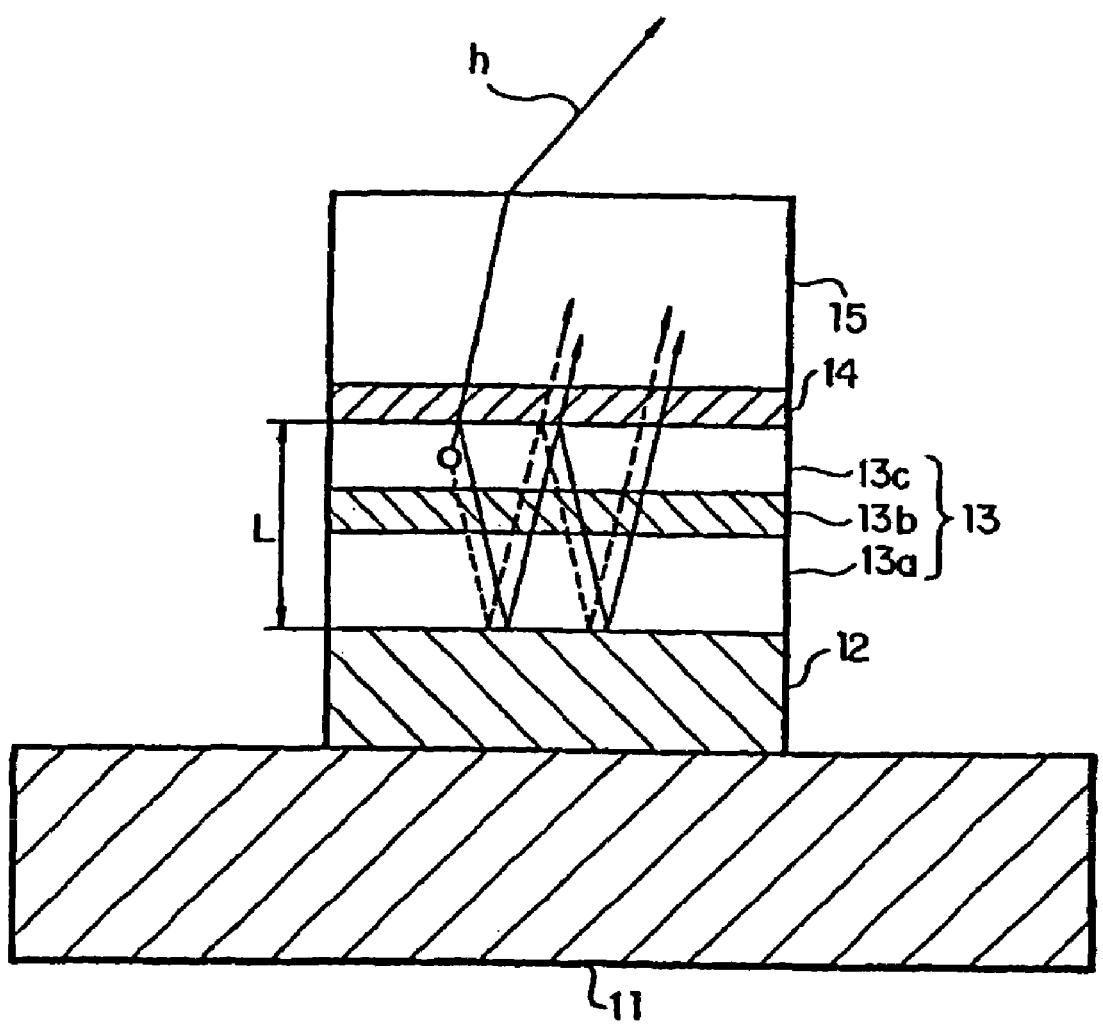
FIG. 4 is a cross-sectional view that shows a central part of an organic EL device according to the first embodiment of the invention.

FIG. 4 shows an organic EL device according to the first embodiment of the invention. The organic EL device shown in FIG. 4 is a so-called top surface emission type organic EL device, and includes a first electrode 12, organic layer 13, semitransparent reflection layer 14 and second electrode 15 stacked on a substrate 11 sequentially from bottom to top.

The substrate 11 is, for example, a transparent glass substrate, semiconductor substrate, or the like, and may be flexible.

The first electrode 12 is used as an anode electrode that functions as a reflection layer as well, and it is made of a light reflective material such as platinum (Pt), gold (Au), chromium (Cr), tungsten (W), or the like. The first electrode 12 preferably has a thickness in the range from 100 nm to 300 nm.

The organic layer 13 is made by stacking, for example, a buffer layer 13a, hole transport layer 13b and organic light emitting layer 13c also functioning as an electron transport layer, sequentially from bottom. The electron transport layer may be provided separately from the organic light emitting layer 13c. The buffer layer 13a is a layer for preventing leakage, and may be made of, for example, m-MTDATA [4, 4', 4"-tris (3-methylphenylphenylamino) triphenylamine], 2-TNATA [4, 4', 4"-tris (2-naphtylphenylamino) triphenylamine], or the like. The buffer layer 13a may be omitted if leakage is in an acceptable level. The hole transport layer 13b may be made of, for example, α-NPD [N,N'-di(1-naphthyl)-N,n'-diphenyl-[1,1'-biphenyl]-4,4'-diamine]. The organic light emitting layer 13c is made of different light emitting materials having emission colors of red (R), green (G) and blue (B). For example, as the light emitting material having the G emission color, Alq3 (tris-quinolinolaluminum complex) may be used.

These layers forming the organic layer 13 are preferably in specific thickness ranges, i.e. for the buffer layer 13a from 15 nm to 300 nm, for the hole transport layer 13b from 15 nm to 100 nm and for the organic light emitting layer 13c from 15 nm to 100 nm, respectively. However, thicknesses of the organic layer 13 and the layers forming it are determined so that their optical film thicknesses become the values explained later.

The semitransparent reflection layer 14 form a cathode electrode, and it is made of, for example, magnesium (Mg), silver (Ag) or their alloy. The semitransparent reflection layer 14 preferably has a thickness in the range from 5 nm to 50 nm.

The second electrode 15 is made of a material typically used as a transparent electrode, such as indium tin oxide (ITO) or an oxide of indium and zinc. Let the second electrode 15 have a thickness in the range from 30 nm to 1000 nm. A passivation film (not shown) made of a transparent dielectric overlies the second electrode 15. The transparent dielectric preferably has a refractive index approximately equal to that of the material forming the second electrode 15. As such material, silicon oxide ($SiO_2$), silicon nitride (SiN), or the like, can be used, and may be stacked to a thickness from 500 nm to 10000 nm, for example.

In this EL device, the first electrode 12 of a light reflective material, organic layer 13 and semitransparent reflection layer 14 make up a cavity structure, and the organic layer 13 functions as a cavity portion. Therefore, optical path length L between the first electrode 12 and the semitransparent reflection layer 14, i.e. the optical thickness of the cavity portion, which is the organic layer 13, is determined to satisfy the following equation (6), and in this range, optical path length $L_{min}$ that is the positive minimum value is especially employed.

$$(2L)/\lambda + \Phi/(2\Pi) = m \text{ (m is an integer)} \quad (6)$$

where the phase shift produced when the light h generated in the organic light emitting layer 13c reflects at the first electrode 12 and the semitransparent reflection layer 14 is $\Phi$ radian, and $\lambda$ is the peak wavelength of the spectrum of the light h to be extracted from the light h emitted in the organic light emitting layer 13c.

Thicknesses of respective layers forming the organic layer 13 are determined to satisfy it. Optical distance L of the cavity portion is determined by the following equation (7) from refractive indices n1, n2, ..., nk and thicknesses d1, d2, ..., dk of respective layers of the organic layer 13 (buffer layer 13a, hole transport layer 13b and organic light emitting layer 13c in the first embodiment).

$$L = n1 \times d1 + n2 \times d2 + \ldots + nk \times dk \quad (7)$$

An example of calculation of L is shown here. If the buffer layer 13a is made of 2-TNATA, the hole transport layer 13b is made of $\alpha$-NPD, the organic light emitting layer 13c is made of Alq3, their thicknesses are d1=32 nm, d2=30 nm, d3=50 nm, respectively, and $\lambda$=535 nm, then n1=1.9, n2=1.8 and n3=1.7. Therefore, $$L = 1.9 \times 32 + 1.8 \times 30 + 1.7 \times 50 = 200 \text{ nm}$$

$\Phi$ is derived as follows. That is, first stacked on a substrate (for example, Si substrate) is the reflection layer (Cr, or the like) or a semitransparent reflection layer (Mg, Ag, Mg—Ag alloy, or the like) to a thickness not thinner than 200 nm. Then using a spectroellipsometric apparatus (for example, a product of the manufacturer SOPRA), refractive index n and absorption coefficient k of the reflection layer or semitransparent reflection layer is determined.

The phase shift of the reflection layer can be calculated from its n and k, and refractive index n of the organic layer in contact with the reflection layer (see, for example, Principles of Optics, Max Born and Emil Wolf, 1974 (PERGAMON PRESS)).

The phase shift of the semitransparent reflection layer can be similarly calculated by using its n and k, as well as refractive index n of the organic layer in contact with the semitransparent reflection layer, thickness of the semitransparent reflection layer, refractive indices and thicknesses of respective transparent films over it. Also the refractive indices of the organic layer and respective transparent films can be measured using a spectroellipsometric apparatus.

The sum of those two phase shift amounts is $\Phi$.

As an exemplary value of $\Phi$, $\Phi = -4.7$ radians when $\lambda = 535$ nm.

In the organic EL device having the above-explained configuration, the first electrode 12 as the reflection layer, organic layer 13 and semitransparent reflection layer 14 make up a cavity structure, the organic layer 13 as the cavity portion functions as a narrow-band-pass filter, and only the light h near the peak wavelength $\lambda$ of the spectrum to be extracted is enhanced by multiple interference and extracted through the second electrode 15. Therefore, light h of a spectrum having a high peak intensity is extracted. In addition, since thickness of the organic layer 13 is adjusted to the positive minimum value within values acceptable for the first electrode 12, organic layer 13 and semitransparent reflection layer 14 to make up a cavity structure, spectrum of the extracted light h is kept widest within the range bringing about multiple interference of light having the wavelength $\lambda$.

Figure 5:
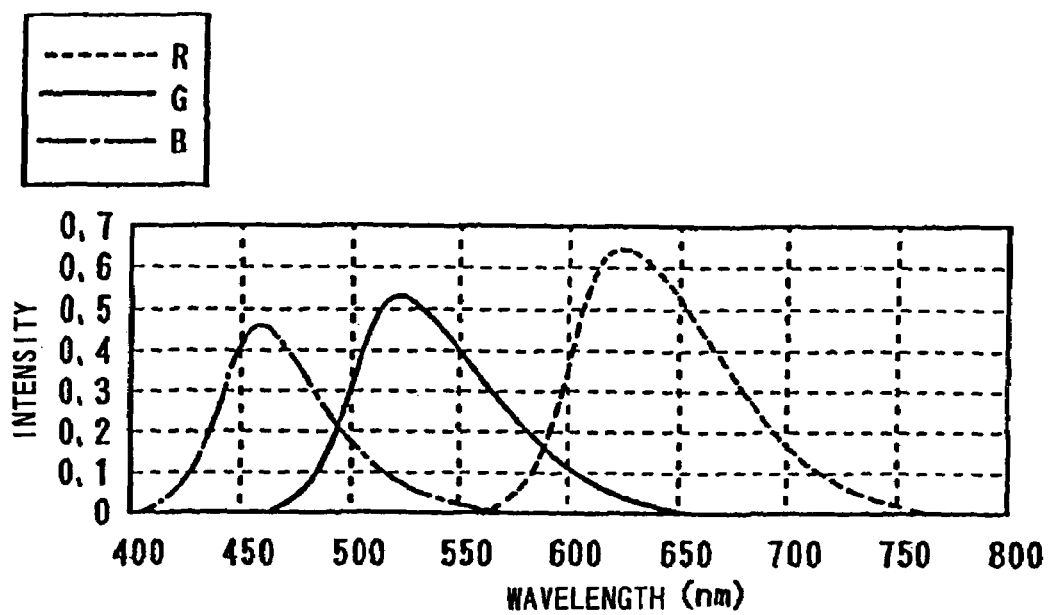
FIG. 5 is a schematic diagram that shows a simulation of light spectrums extracted from the organic EL device according to the first embodiment of the invention.
Figure 6:
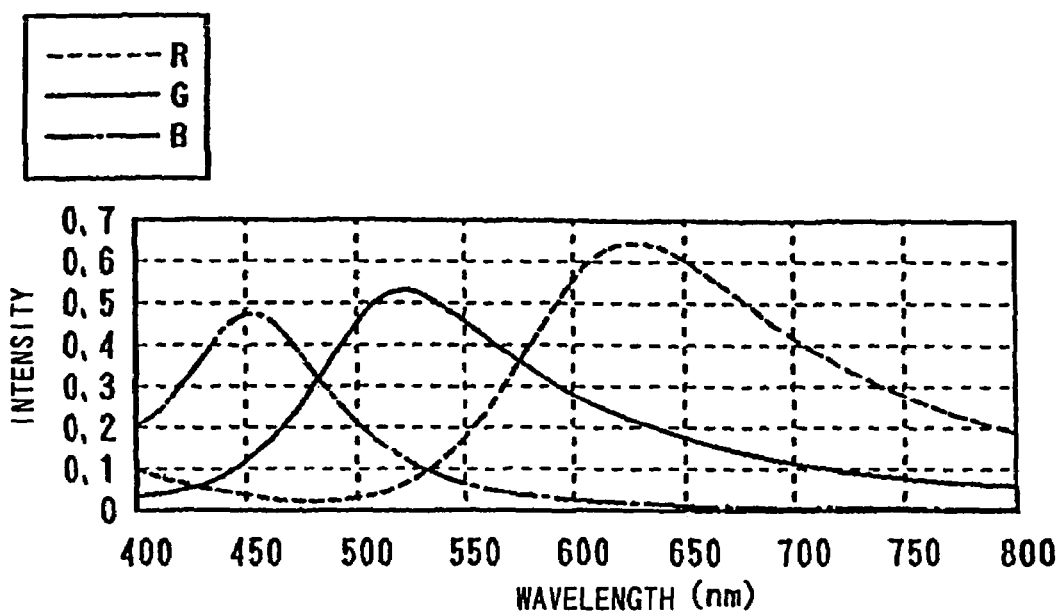
FIG. 6 is a schematic diagram that shows a simulation of spectrums to show the filtering property of the organic layer itself in the organic EL device according to the first embodiment of the invention.
Figure 7:
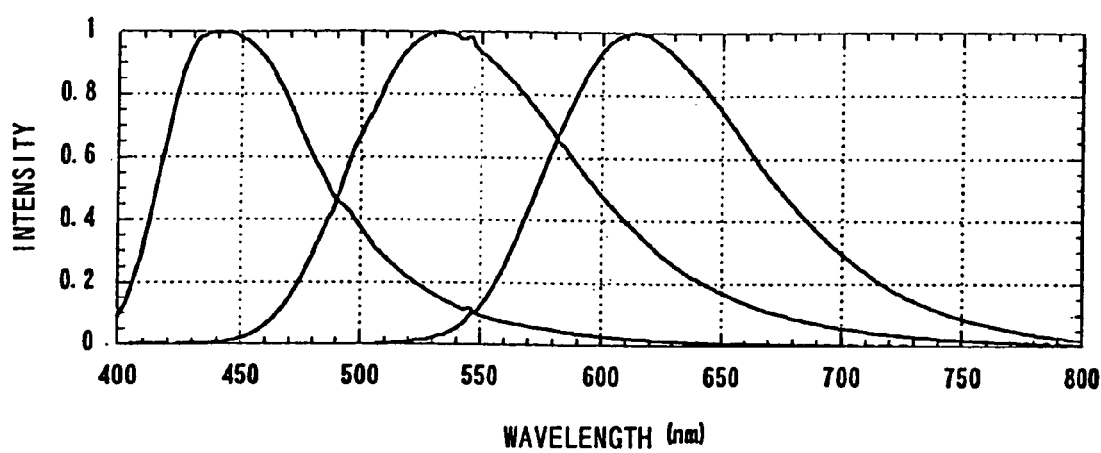
FIG. 7 is a schematic diagram that shows a simulation of internal emission spectrums in the organic EL device according to the first embodiment of the invention.

FIG. 5 shows a simulation of light spectrums extracted from organic EL devices different in emission color, designed as explained above (as applied here, m=0 in Equation (6)). Chromium was used as the first electrode 12, and silver-magnesium alloy was used as the semitransparent reflection layer 14. FIG. 6 shows a simulation of spectrums to show the property as a simple filter of each organic layer 13 having the same design. The spectrums shown in FIG. 5 are obtained by multiplying respective spectrums of FIG. 5 by spectrums of light extracted without multiple interference after being emitted in the organic light emitting layer 13c, that is, internal emission spectrums shown in FIG. 7.

Figure 8:
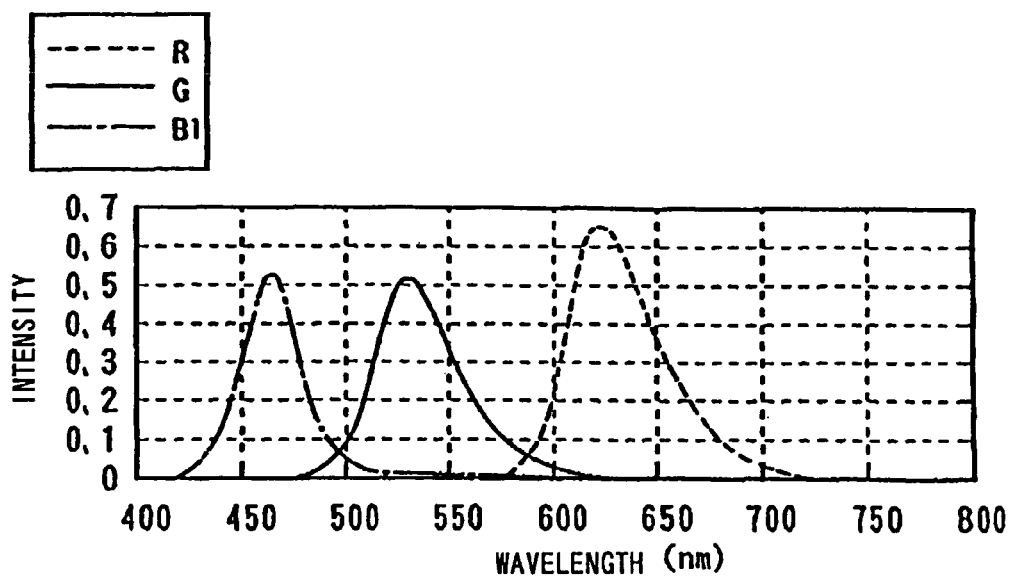
FIG. 8 is a schematic diagram that shows a simulation of light spectrums extracted from a conventional EL device.
Figure 9:
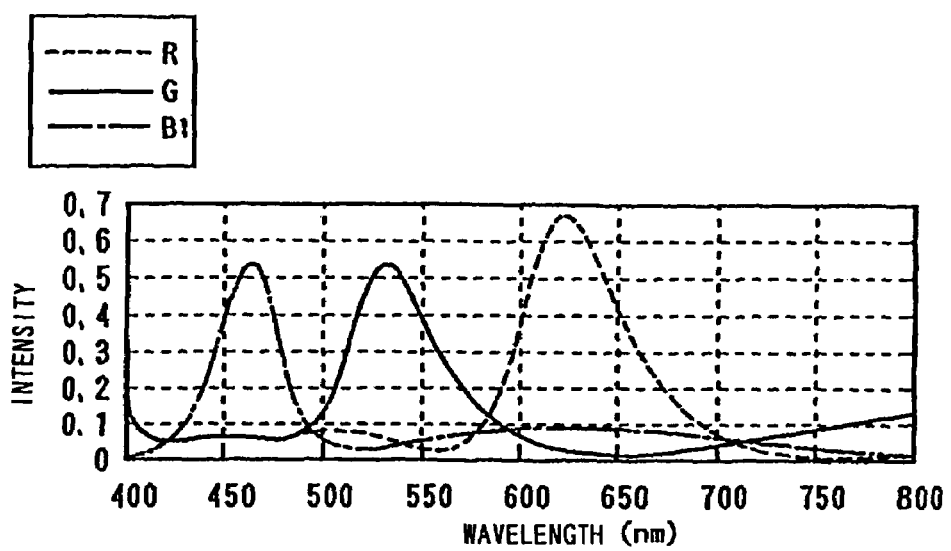
FIG. 9 is a schematic diagram that shows a simulation of spectrums to show the filtering property of the organic layer itself in the conventional organic EL device.

As a comparative example, FIG. 8 shows a simulation of spectrums of light extracted from EL devices in which optical path length L satisfying Equation (6) does not become the positive minimum value (here m=1). Organic EL devices taken as the comparative example have the same configuration as the first organic EL device except for the optical path length L of the cavity portion. Thickness of each organic layer 13 was adjusted by adjusting the thickness of the buffer layer 13a to be 240 nm in the organic EL device for emission of light in the red (R) region, 190 nm in the organic EL device for emission of light in the green (G) region, and 150 nm in the organic EL device for emission of light in the blue (B) region. FIG. 9 shows a simulation of spectrums to show the property as a simple filter of each organic layer having the same design as the comparative example. Spectrums shown in FIG. 8 are obtained by multiplying spectrums shown in FIG. 9 by spectrums of light extracted without multiple interference after being emitted in the organic light emitting layer 13c, that is, internal emission spectrums shown in FIG. 7.

As apparent from comparison of these figures, by determining the thickness of the organic layer 13 like the first embodiment, while subjecting the light h extracted from the organic EL device to multiple interference, its spectrum can maintain a certain width. Therefore, in the organic EL device according to the first embodiment, even when the view angle is offset, the shift amount of the wavelength $\lambda$ can be limited to a small value, and color purity can be improved over a wider view angle range.

Figure 10:
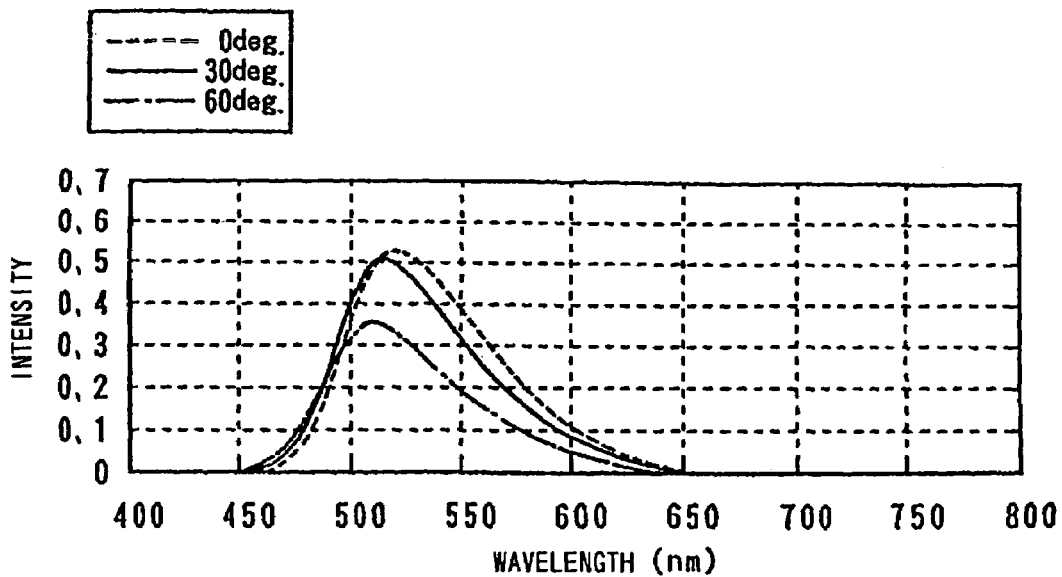
FIG. 10 is a schematic diagram that shows dependency of the organic EL device (G emission) according to the first embodiment of the invention upon the view angle.
Figure 11:
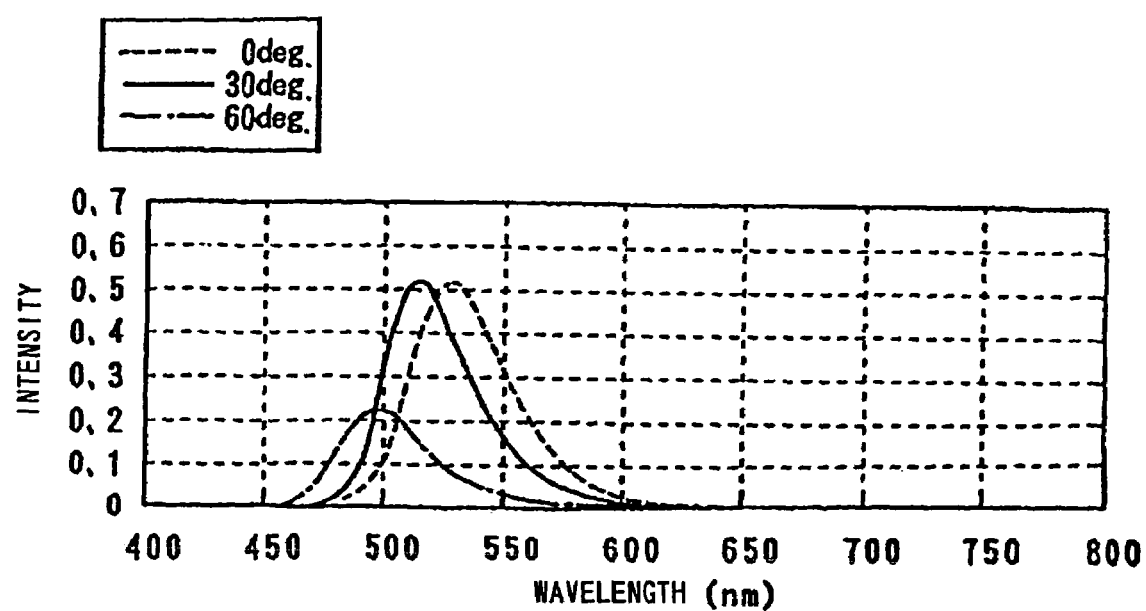
FIG. 11 is a schematic diagram that shows dependency of the conventional organic EL device (G emission) upon the view angle.

FIG. 10 shows dependency of the organic EL device (m=0) according to the first embodiment of the invention upon the view angle. Here is shown a light spectrum of the green (G) wavelength measured from angles of 0° (straight forward), 30° and 60° relative to the display plane. FIG. 11 is a graph that shows dependency of an organic EL device (m=1) as a comparative example upon the view angle.

As apparent through comparison of FIGS. 10 and 11, in the organic EL device according to the first embodiment, the spectral peak does not shift substantially even when the view angle is offset by 300, and even when the view angle is offset 60°, shifting of the spectral peak is within about 10 nm. In contrast, in the organic EL device taken as the comparative example, when the view angle is offset by 60°, the spectral peak shifts toward shorter wavelengths as much as 30 nm as shown in FIG. 11, and the color has changed. It has been confirmed from the comparison that the organic EL device according to the first embodiment can restrict shifting of the peak position of the spectrum of the extracted light h within a smaller value than the organic EL device as the comparative example even when the view angle is large.

Its reason is shown below. That is, when viewed obliquely from θ radians, Equation (6) can be rewritten as the following equation (8).

$$(2L)/\lambda' \times \cos\theta + \Phi/2(\Pi) = m \quad \text{(m is an integer)} \tag{8}$$

If $\lambda' = \lambda + \Delta\lambda$ ($\lambda$ is the peak wavelength of the filter property spectrum when the light emitting surface is viewed from the frontal direction), then $\Delta\lambda = (1 - \cos\theta)\lambda$, the shift amount $\Delta\lambda$ of the peak of the filter property spectrum does not depend on the integer m defining the thickness of the organic layer for making up the cavity structure, but merely depends upon the view angle.

However, for a reason explained later, with a smaller m, the filter property spectrum is gentler and wider, i.e. broader, and the shifting amount of the peak of the spectrum of the extracted light is smaller. Therefore, in the organic EL device according to the first embodiment, color purity is improved in a wider view angle range. As a result, in a direct view type color display apparatus made by using this organic EL device, a sufficient color reproduction range can be ensured over wider view angles.

The phenomenon that the filter property spectrum becomes broader with a small m as explained above occurs by the following reason. In case the sum of the phase shifting values of reflected light generated in the anode electrode, i.e. first electrode 12, and the cathode electrode, i.e. semitransparent reflection layer 14 is $\Phi$ radians, L is the optical path length of the organic layer 13, and $\lambda$ is the wavelength of light, if the phase delay per each multiple interference is $\delta$, $$\delta = 2\Pi \cdot 2L/\lambda + \Phi \tag{9}$$

Here, a value of $\lambda$ satisfying $$\delta = 2\Pi \cdot m \quad \text{(m is an integer)} \tag{10}$$

is the peak wavelength of the narrow-band-pass filter. When it is $\lambda_{max}$, then from Equations (9) and (10), $$2L/\lambda_{max} + \Phi/2\Pi = m \quad \text{(m is an integer)} \tag{11}$$

is obtained. As the optical path length L becomes smaller in Equation (9), the spectral width of the narrow-band-pass filter becomes broader with a smaller m as will be understood from the fact that the changing amount of $\delta$ relative to the changing amount of $\lambda$ decreases.

Figure 1:
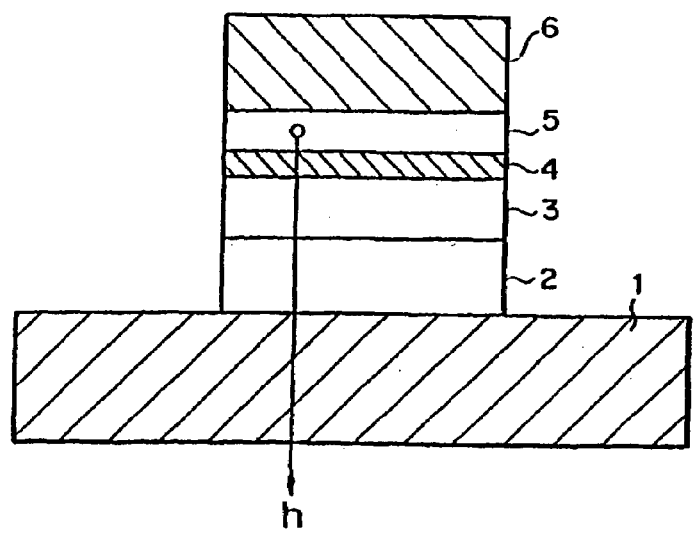
FIG. 1 is a cross-sectional view that shows a configuration of a central part of a conventional organic EL device.
Figure 2:
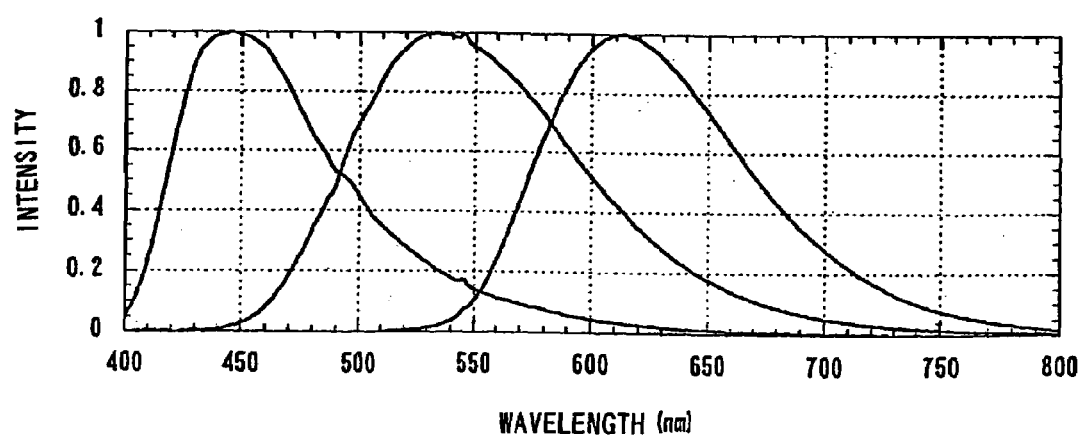
FIG. 2 is a schematic diagram that shows color spectrums extracted from a conventional organic EL device.
Figure 3:
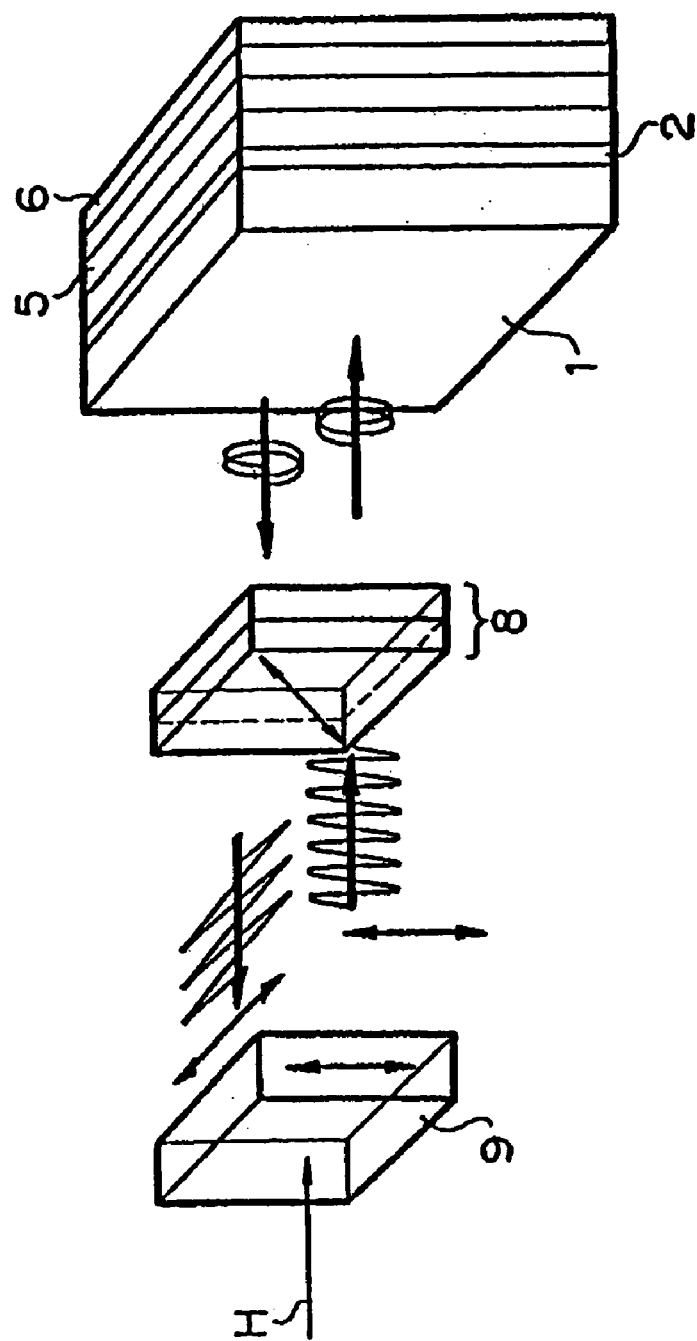
FIG. 3 is a schematic diagram that shows a configuration of a conventional display device directed to preventing reflection of external light.
Figure 12:
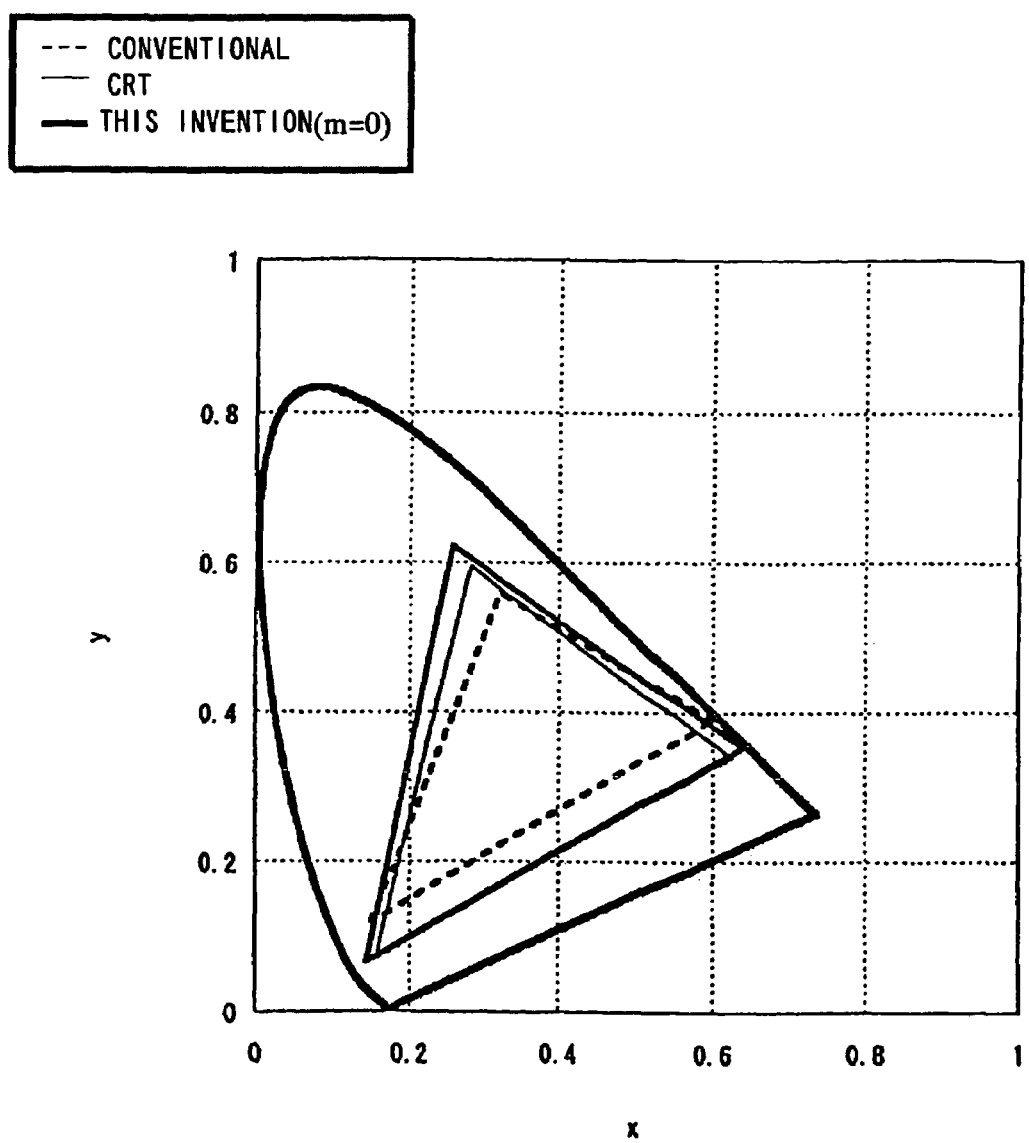
FIG. 12 is a schematic diagram that shows chromaticity coordinates of the organic EL device according to the first embodiment of the invention and a comparative example.

FIG. 12 is a schematic diagram that shows chromaticity coordinates of light extracted from the organic EL device according to the first embodiment (the present invention), made by actual measurement using a chromatic photometer (BM-7 by Topcon Corporation). Also shown as a comparative example are chromaticity coordinates (conventional) corresponding to the spectrum of light extracted from the conventional organic EL device already explained by using chromaticity coordinates (CRT) of CRT (cathode ray tube) and FIG. 1. In FIG. 12, the curve portion of the outermost line shows the spectrum locus, and the linear portions thereof show the purple boundary. As understood from comparison of these chromaticity coordinates, it has been confirmed that chromaticity coordinates of the organic EL device according to the first embodiment represent a significantly enlarged color reproduction range as compared with the conventional one and that substantially the same color reproduction range as CRT is ensured.

Figure 13:
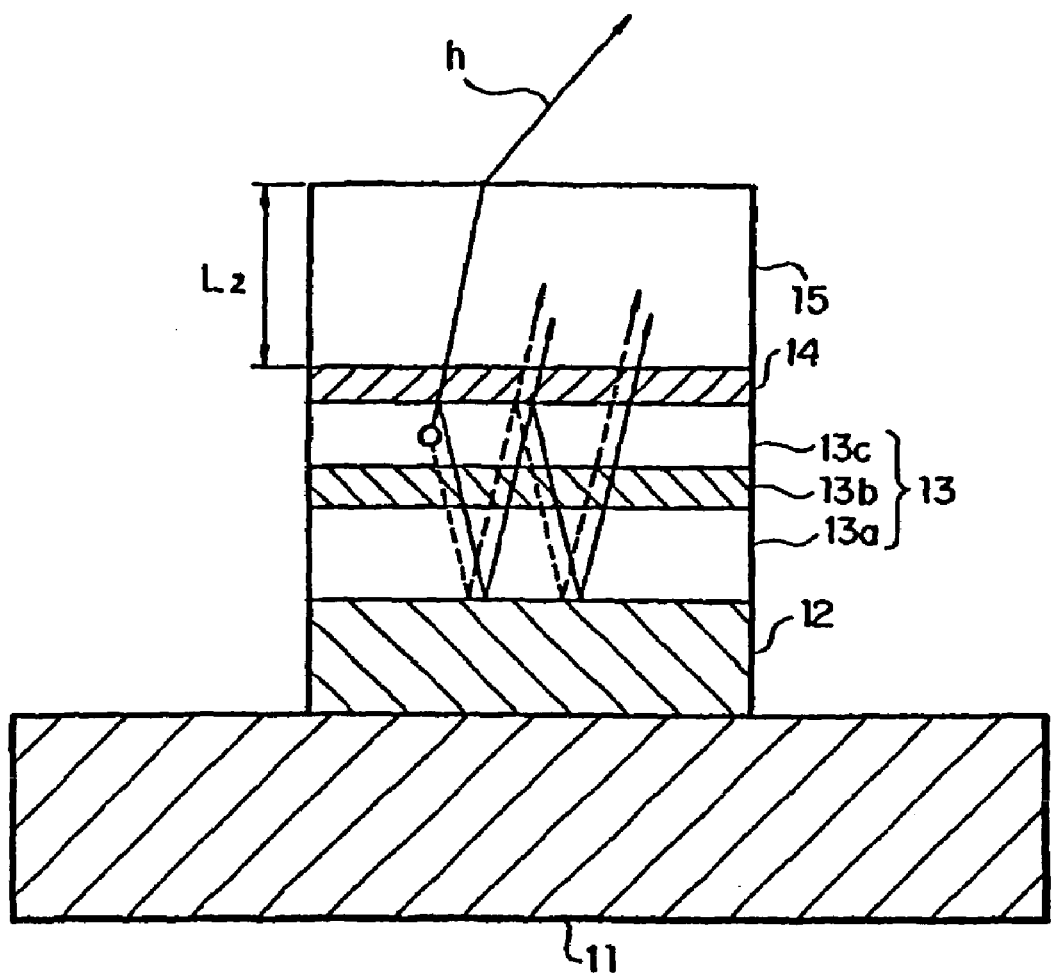
FIG. 13 is a cross-sectional view that shows a central part of an organic EL device according to the second embodiment of the invention.

FIG. 13 shows an organic EL device according to the second embodiment of the invention. The organic EL device shown in FIG. 13 is based on the organic EL device according to the first embodiment shown in FIG. 4, but its cavity structure is made up of the semitransparent reflection layer 14, second electrode 15 and the top end interface (for example, interface with the atmospheric layer) of the second electrode. Reflectance at the interface between the end surface of the second electrode 15 and the atmospheric layer is as large as approximately 10%, and here are used effects of the cavity having the second electrode 15 made of a transparent material as its cavity portion.

Therefore, as the distance between the atmospheric layer and the semitransparent reflection layer 14, i.e. optical path length L (here is expressed as $L_2$ for the purpose of distinction from the first embodiment) of the cavity portion the second electrode 15 forms, here is employed the optical path length $L_2$ that satisfies the following equation (13) made by adding 4 to the value of m ensuring $L_1$ to become the positive minimum value (such m is written as m1) among values of m satisfying the following equation (12). Assume here that the phase shift produced when light h generated in the organic light emitting layer 13c reflects at the opposite ends of the cavity portion (second electrode 15) is $\Phi$, and the peak wavelength of the spectrum of the light is $\lambda$. In case a passivation film of a transparent dielectric material having a refractive index equivalent to the second electrode 15 is provided on the second electrode 15, the passivation film and the second electrode 15 function as the cavity portion.

$$(2L_1)/\lambda + \Phi/(2\Pi) = m \quad \text{(m is an integer)} \tag{12}$$

$$(2L_2)/\lambda + \Phi/(2\Pi) = m1 + 4 \tag{13}$$

Figure 14:
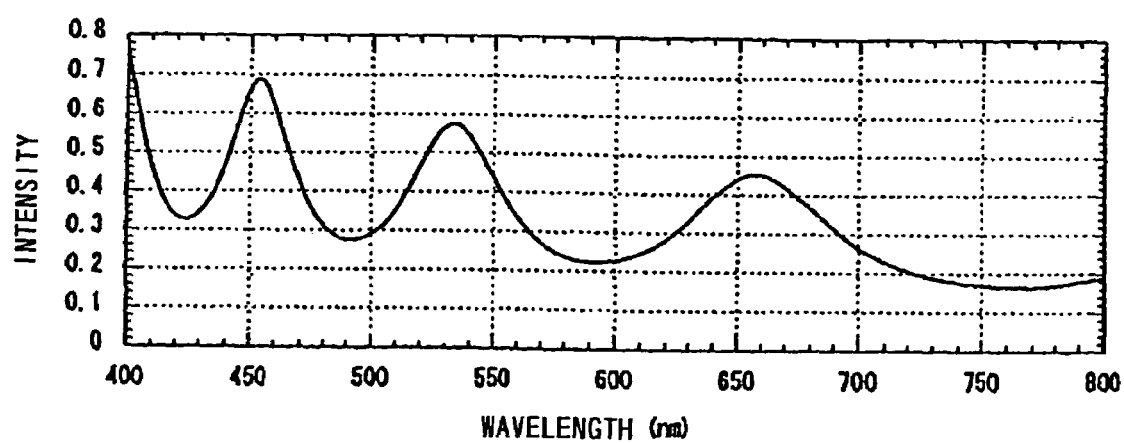
FIG. 14 is a schematic diagram that shows a simulation of spectrums to show the filtering property of the organic layer itself in the organic EL device according to the second embodiment of the invention.

The cavity portion (i.e. second electrode 15) thus designed brings about multiple interference of light of respective wavelengths corresponding to the red (R), green (G) and blue (B) regions as shown in FIG. 14. Therefore, optical path length $L_2$ of the cavity portion need not be determined for each color, and a common optical path length $L_2$ can be used in cavity portions in form of second electrodes 15 in all organic EL devices corresponding to respective emission colors.

Figure 15:
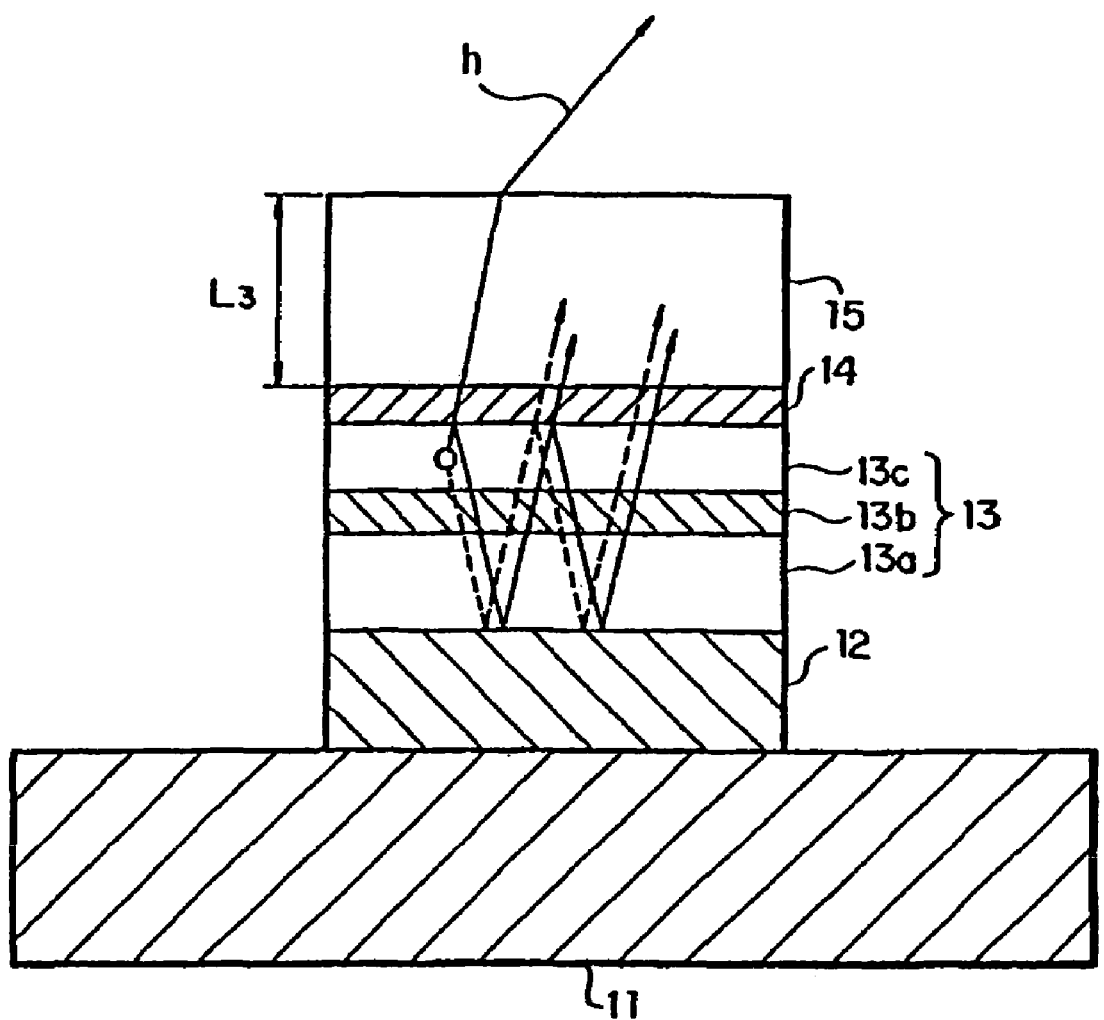
FIG. 15 is a cross-sectional view that shows a central part of an organic EL device according to the third embodiment of the invention.
Figure 16:
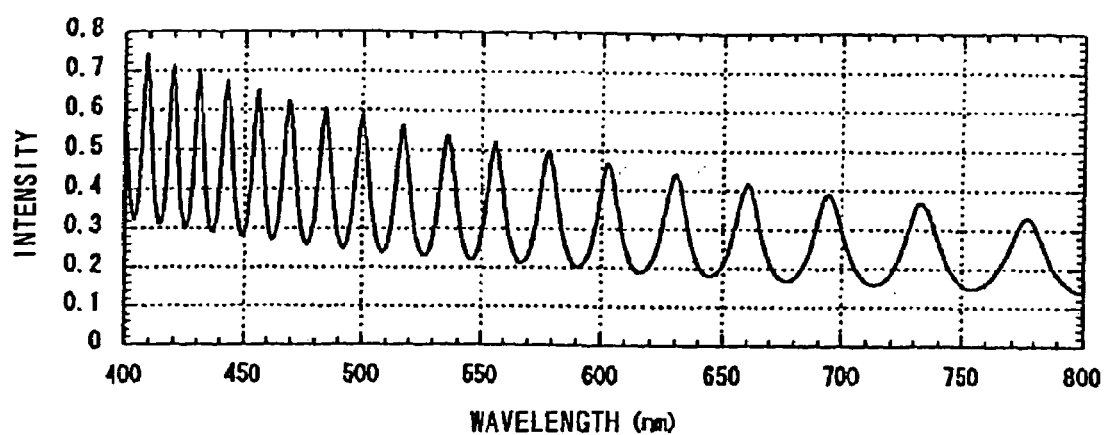
FIG. 16 is a schematic diagram that shows a simulation of spectrums to show the filtering property of the organic layer itself in the organic EL device according to the third embodiment of the invention.

FIG. 15 shows an organic EL device according to the third embodiment of the invention. The organic EL device shown in FIG. 15 is based on the organic EL device according to the first embodiment shown in FIG. 14, but its cavity structure is made up of the semitransparent reflection layer 14, second electrode 15 and the top end interface (for example, atmospheric layer) of the second electrode 15.

As the distance between the atmospheric layer and the semitransparent reflection layer 14 in this organic EL device, i.e. optical path length L (here is expressed as $L_3$ for the purpose of distinction from the first embodiment and the second embodiment) of the cavity portion the second electrode 15 forms, here is employed the optical path length $L_3$ that satisfies the following equation (15) made by adding an integer q not smaller than 10, preferably an integer q1 not smaller than 18, to the value of m ensuring $L_1$ to become the positive minimum value (such m is written as m1) among values of m satisfying the following equation (14). Assume here that the phase shift produced when light h generated in the organic light emitting layer 13c reflects at the opposite ends of the cavity portion (second electrode 15) is $\Phi$, and the peak wavelength of the spectrum of the light is $\lambda$. In case a passivation film of a transparent dielectric material having a refractive index equivalent to the second electrode 15 is provided on the second electrode 15, the passivation film and the second electrode 15 function as the cavity portion.

$(2L_1)/\lambda+\Phi/(2\Pi)=m$ (m is an integer) (14)

$(2L_3)/\lambda+\Phi/(2\Pi)=m1+q$ (15)

Figure 17:
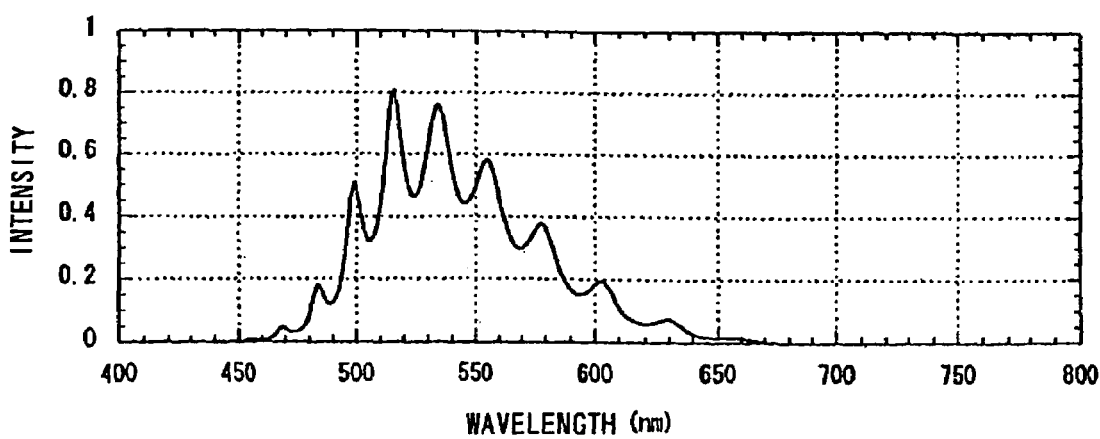
FIG. 17 is a schematic diagram that shows a simulation of light spectrums extracted from the organic EL device (G emission) according to the third embodiment of the invention.

The cavity portion (i.e. second electrode 15) thus designed brings about multiple interference of light of a large number of wavelengths corresponding to the red (R), green (G) and blue (B) regions as shown in FIG. 14. Therefore, similarly to the second embodiment, optical path length $L_3$ of the cavity portion need not be determined for each color, and a common optical path length $L_3$ can be used in cavity portions in all organic EL devices corresponding to respective emission colors. In addition to that, as shown in FIG. 17, since the light extracted after multiple interference (light in the green (G) region in FIG. 17) results in having a plurality of fine peaks, the entire spectral width of the extracted light h becomes substantially wider. Therefore, similarly to the organic EL device according to the first embodiment, color purity can be improved over wider view angles. As a result, a direct-view color display apparatus made by using the organic EL device exhibits a sufficient color reproducibility in wide view angles.

The second and third embodiments are applicable either in combination with the first embodiment or independently. Configurations of the cavity portions explained as the second and third embodiments are also applicable to the cavity portion made up of the organic layer 13. However, cavity portions explained in the second and third embodiments will be optimum for use in a configuration using as the cavity portion the second electrode 15 having a relatively high freedom toward a thicker thickness. Additionally, structure of the cavity portion explained in the first embodiment is applicable also to cavity portion made up of the second electrode 15 (and the passivation film thereon).

Further, the foregoing embodiments are not limited to application to the top surface emission type organic EL device as shown in FIG. 4. For example, although the anode electrode explained as being the first electrode 12 made of a metal film having a high work function, it may be made in form of a two-layered structure stacking a transparent electrically conductive film on a dielectric multi-layered film or a reflection film of aluminum (Al), for example. In this case, this reflection film serves as the first electrode in the context of the invention. The transparent conductive film forms a part of the cavity portion.

Figure 18:
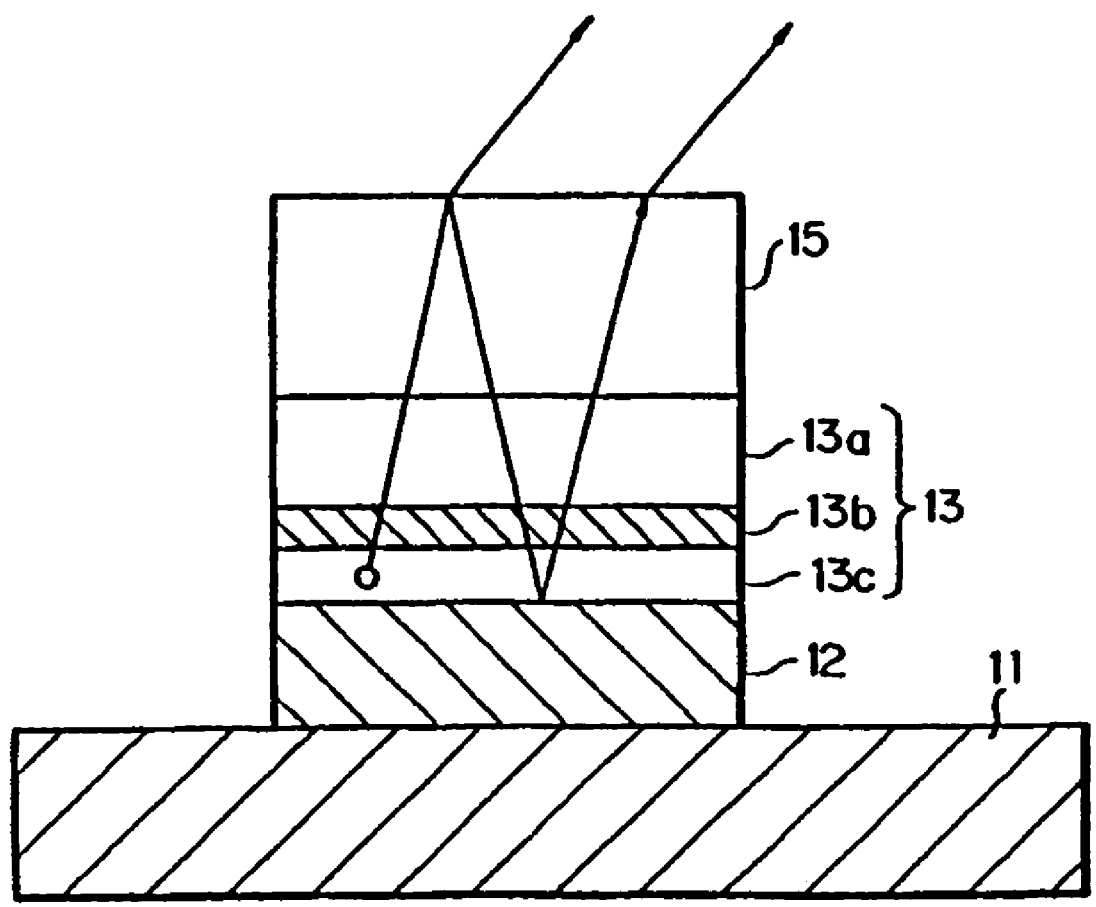
FIG. 18 is a cross-sectional view that shows a central part of a further organic EL device to which the invention is applied.

Furthermore, the embodiments are applicable also to the structure as shown in FIG. 18, in which the first electrode 12 is a cathode electrode made of a light reflective material, the second electrode 15 is an anode electrode made of a transparent electrode, and the organic light emitting layer 13c, hole transport layer 13b and buffer layer 13c are stacked sequentially from the first electrode 12. In this case, the organic layer 13 and the second electrode 15 in combination are used as one cavity portion, and light generated in the organic light emitting layer 13c is reflected by the bottom end of the organic layer 13 (interface with the first electrode 12) and the top end of the second electrode 14 (interface with the atmospheric layer). Additionally, in this configuration, a semitransparent reflection layer (not shown) made of a material having a high work function, such as Pt, Au or Cr, can be used also in a configuration interposing it between the organic layer 13 and the second electrode 15. In this case, structure f the cavity portion will be the same as those of the first to third embodiments.

The invention is not limited to top surface emission type organic EL devices, but it is also applicable to transmission type organic EL devices using a transparent substrate 11, although not explained with reference to drawings. Further, it is also applicable to organic EL devices connected to a thin film transistor on the substrate 11.

Fourth Embodiment

Figure 19:
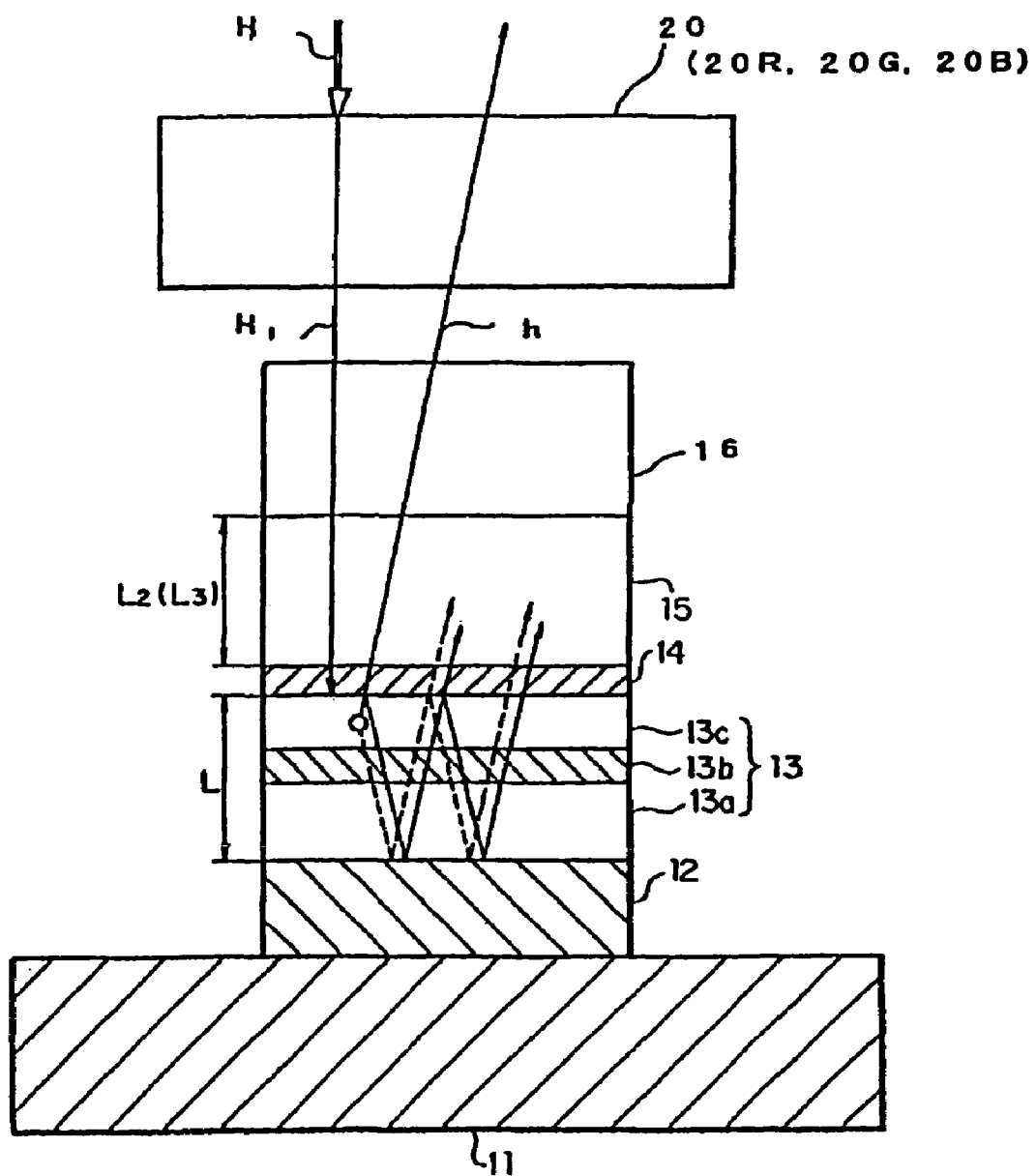
FIG. 19 is a cross-sectional view that shows a central part of an organic EL device according to the fourth embodiment of the invention.

FIG. 19 is a cross-sectional view that shows a central part of an organic EL device according to the fourth embodiment of the invention. The organic EL device shown in FIG. 19 includes a color filter in addition to the top surface emission type organic EL device according to the first embodiment shown in FIG. 4. More specifically, the first electrode 12 as the reflection layer, organic layer 13 and semitransparent reflection layer 14 make up the cavity structure, with the organic layer 13 as the cavity portion, and a color filter 20 is disposed on the semitransparent reflection layer 14 via the second electrode (transparent electrode) 15 and the passivation film 16.

Let the color filter 20 be configured to transmit only light h near the peak wavelength $\lambda$ of a spectrum to be extracted from the organic EL device. That is, a device for emitting light in the red (R) region has a color filter 20R that transmits light exclusively in the red (R) region, a device for emitting light in the green (G) region has a color filter 20G that transmits light exclusively in the green (G) region, and a device for emitting light in the blue (B) region has a color filter 20B that emits light exclusively in the blue (B) region.

Optical distance L of the cavity portion, which is the organic layer 13, is designed to be widest in the range bringing about multiple interference of light h near the peak wavelength $\lambda$ of the spectrum to be extracted as already explained in the first embodiment. The wavelength range of the light h to be extracted from each organic layer 13 preferably coincides with the wavelength range in which each color filter 20 exhibits the highest transmittance.

In the organic EL device with this configuration, among external light H irradiated from the display surface side (surface nearer to the color filter 20), only light $H_1$ near the peak wavelength $\lambda$ of the spectrum to be extracted from the organic EL device can transmit the color filter 20 and reaches the cavity portion (organic layer 13 in this case), and external light with other wavelengths is prevented from intruding inside the device beyond the color filter 20.

Since the cavity portion (i.e. organic layer 13) is a narrow-band-pass filter that transmits light near the peak wavelength $\lambda$ to be extracted, its transmittance for the external light $H_1$ near the peak wavelength $\lambda$ is very high. That is, reflectance to the external light $H_1$ is very low. Therefore, external light $H_1$ near the peak wavelength $\lambda$ intruding through the color filter 20 is prevented from reflection in the organic layer 13 and from again passing through the color filter 20 to radiate externally.

Figure 20:
FIG. 20 is a schematic diagram that shows a simulation of spectrums to show the external light reflection property of the organic EL device according to the fourth embodiment of the invention, when using no color filter.
Figure 20:
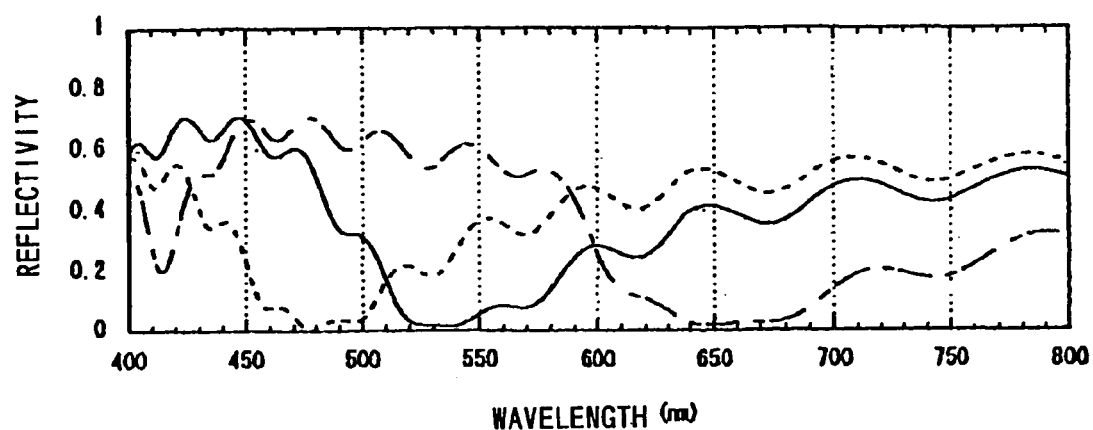

FIG. 20 shows a result of simulation of external light reflectance of organic EL devices having no color filter (organic EL devices shown in FIG. 4).

In FIG. 20, B indicates external light reflection of an organic EL device for emission of the blue (B) color, G indicates external light reflection of an organic EL device for emission of the green (G) color, and R indicates external light reflection of an organic EL device for emission of the red (R) color. As shown in FIG. 20, any of these organic EL devices limits the reflectance of external light near the peak wavelength λ of each corresponding emission color to a low value. That is, in the organic EL device for blue color emission, reflection of external light in the blue (B) region is low. Similarly, in the organic EL device for red color emission and green color emission, reflectance of external light in their respective target wavelength regions is prevented.

Figure 21:
FIG. 21 is a schematic diagram that shows spectrums representing transmission properties of different color filters used in the organic EL device according to the fourth embodiment of the invention.
Figure 21:
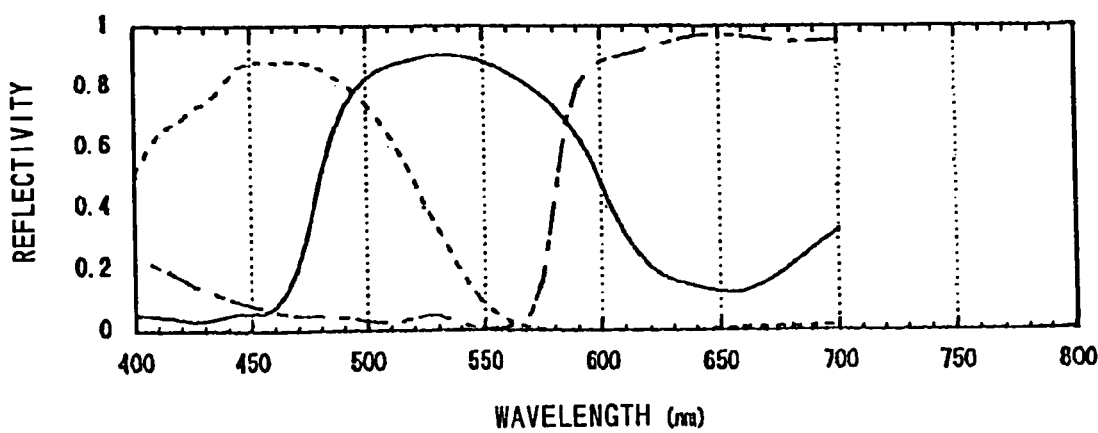

FIG. 21 shows transmission properties of color filters (20R, 20G, 20B) disposed in respective organic EL devices. In FIG. 21, B indicates transmission property of the organic EL device for emission of the blue (B) color, G indicates transmission property of the organic EL device for emission of the green (G) color, and R indicates transmission property of the organic EL device for emission of the red (R) color. As shown in FIG. 21, in any of the color filters, transmittance is high near the peak wavelength λ of each emission color.

In case the external light reflectance of the organic EL device shown in FIG. 4 having no color filter is $R(\lambda)$ and transmittance of the a color filter is $T(\lambda)$, external light reflectance $Rt(\lambda)$ of the organic EL device shown in FIG. 19 having the color filter is expressed by the following equation (16).

$$Rt(\lambda)=T(\lambda) \times R(\lambda) \times T(\lambda) \qquad (16)$$

Figure 22:
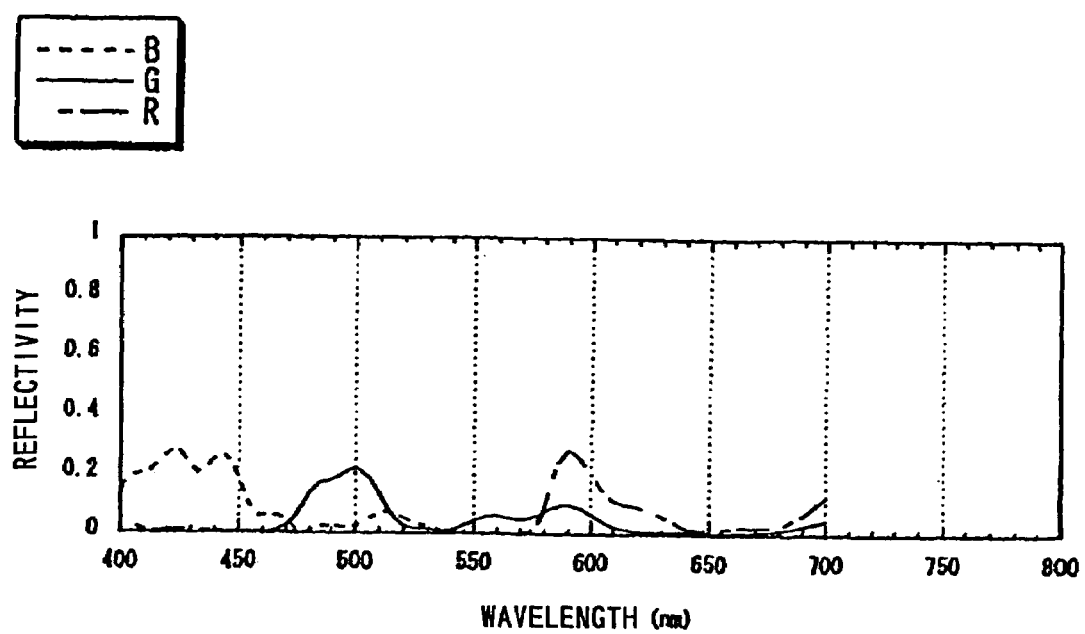
FIG. 22 is a schematic diagram that shows a simulation of spectrums to show the external light reflection property of the organic EL device according to the fourth embodiment of the invention.

Shown in FIG. 22 is a result of simulation as the external light reflectance of the organic EL device shown in FIG. 19, combining the graphs of FIGS. 20 and 21 on the basis of Equation (16). In FIG. 22, B indicated external light reflection of the organic EL device for blue (B) color emission, G indicates external light reflection of the organic EL device for green (color) emission, and R indicates external light reflection of the organic EL device of green (G) color emission. As shown in FIG. 22, in any of the organic devices, reflectance of external light is limited to a low value in a wide wavelength region containing the peak wavelength λ of each emission color.

On the other hand, among the emission light generated in the organic layer 13, light h near the peak wavelength λ to be extracted directly passes through the narrow-band-pass filter (organic layer 13) and further through the color filter 20, and it is extracted as display light. Therefore, luminance of the emission light generated in the organic EL device is restricted exclusively by the transmittance of the color filter. However, each organic EL device has the color filter having a high transmittance to light near the peak wavelength λ to be extracted from emission light generated in the organic EL device. Therefore, the decrease of the extraction efficiency of emission light due to the use of the color filter can be minimized, and the decrease of luminance can be minimized.

As a result, the organic EL device can prevent reflection of external light H containing light near the peak wavelength λ to be extracted without preventing extraction of light h near the peak wavelength λ to be extracted among the emission light. Therefore, contrast under external light can be improved significantly while ensuring sufficient luminance of the emission light.

In addition to that, in the organic EL device, since the wavelength range to be extracted after resonation in the organic layer 13 coincides with the wavelength range in which each color filter 20 exhibits a high transmittance, reflection of external light $H_1$ in the wavelength range passing through the color filter 20 can be prevented effectively in the organic layer 13.

Furthermore, similarly to the first embodiment, while inducing multiple interference of light h extracted from the organic EL device, its spectral width can be maintained in a certain width. Therefore, color purity can be improved in a wide view angle range.

The fourth embodiment has been explained, taking the organic EL device having the color filter in addition to the top surface emission type organic EL device according to the first embodiment shown in FIG. 4. The invention, however, is not limited to it, but can be also embodied to include the color filter in each of organic EL devices of configurations explained in the first, second and third embodiments. In any case, the color filter has the above-explained transmittance property.

In organic EL devices additionally having a color filter to respective configurations explained in the second embodiment, contrast under external light can be improved significantly while ensuring a sufficient luminance of emission light similarly to the statement already made, and at the same time, the same effect as the second embodiment, i.e. common use of the optical path length L in cavity portions for different emission colors, can be also obtained.

Further, In organic EL devices additionally having the color filter to configurations explained in the third embodiments, contrast under external light can be improved significantly while ensuring a sufficient luminance of emission light similarly to the statement already made, and simultaneously, the same effect as the third embodiment, i.e. improvement of color purity in a wider view angle range, can be also obtained.

Figure 23:
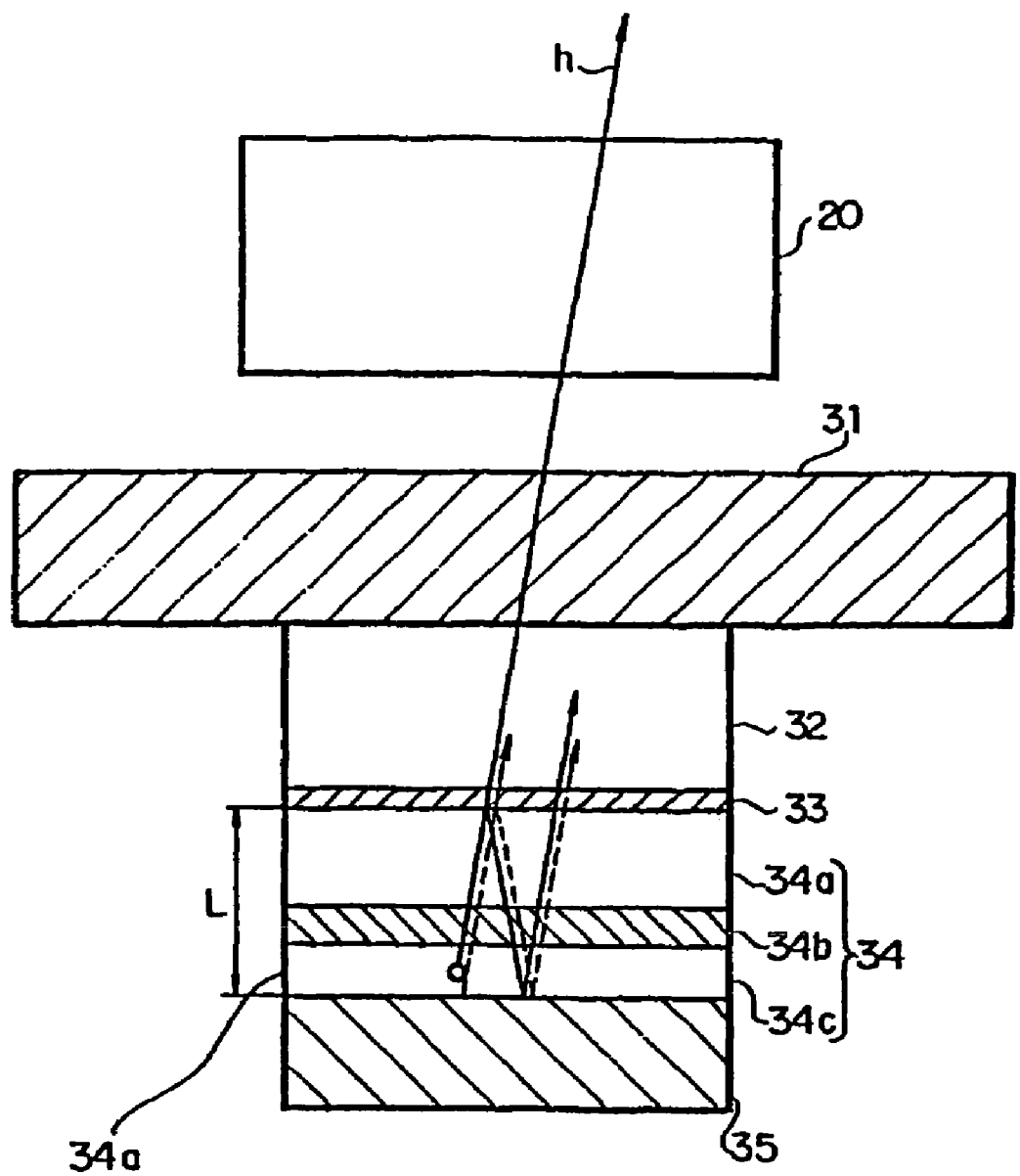
FIG. 23 is a cross-sectional view that shows an alternative configuration of the central part of the organic EL device according to the fourth embodiment.

In case of using the organic EL devices according to the fourth embodiment also to an organic EL device configured to extract emission light through the substrate, the second electrode 32 of a transparent material, semitransparent reflection layer 33 serving as the anode electrode as well, organic layer 34 made up of the buffer layer 34a, hole transport layer 34b and organic light emitting layer 34c, and first electrode 35 that is the cathode electrode serving as the reflection layer as well are sequentially stacked on the transparent substrate as shown in FIG. 23, for example, and an appropriately selected color filter 20 is disposed in combination on the other surface of the transparent substrate 31. Alternatively, the color filter 20 may be disposed between the transparent substrate 31 and the second electrode 32.

As explained above, according to the display device recited in claim 1 of the invention, the cavity structure is optimized to maintain a certain spectral width of light extracted from emission light, intensity of the peak wavelength λ of that light by multiple interference. Therefore, a display device limited in shifting of the wavelength λ of the extracted light and improved in color impurity can be obtained in a wider view angle range. As a result, a display apparatus using this display device can be enlarged in color reproduction range over a wide view angle range.

According to the display device recited in claim 2, emission light of each of wavelengths corresponding to red (R), green (G) and blue (B) can resonate in a common cavity portion. Therefore, optical path length need not specifically determined for each cavity portion of each display device for emission of a specific color, that is, a common optical path length L can be used in all cavity portions.

According to the display device recited in claim 3, it is possible to bring about multiple interference of emission light of a large number of peak wavelengths in respective red (R), green (G) and blue (B) regions in a common cavity portion. Therefore, optical path length need not specifically determined for each cavity portion of each display device for emission of a specific color, that is, a common optical path length L can be used in all cavity portions. Moreover, since each extracted light of each color result in having a plurality of fine peaks, entire spectral width of each light can be increased. Therefore, a display device limited in shifting of the wavelength λ of the extracted light and improved in color impurity can be obtained in a wider view angle range. As a result, a display apparatus using this display device can be enlarged in color reproduction range over a wide view angle range.

According to the display device recited in claim 4, because of the use of the combination of the cavity structure and the color filter, it is possible to prevent reflection of external light in all wavelength ranges containing light of a wavelength to be extracted without preventing radiation of part of emission light corresponding to the target wavelength. Therefore, contrast under external light can be improved significantly while keeping a sufficient luminance of emission light.

What is claimed is:

1. A display device comprising:
    a semi-transparent reflective layer;
    a first electrode of a light reflecting material;
    a second electrode of a transparent material; and
    an organic layer including a light emitting layer interposed between the first electrode and the second electrode,
    wherein,
    a cavity portion comprises one of a gap between an interface between the first electrode and said organic layer and an interface between the organic layer and said semi-transparent reflective layer, a gap between an interface between the semi-transparent reflective layer and the second electrode and an upper edge interface of the second electrode, and a gap between an interface between the first electrode and said organic layer and said upper edge interface of the second electrode,
        wherein an optical path length L' of said cavity portion satisfies the equation:

$(2L')/\lambda + \Phi/(2\pi) = m1 + 4$ (m is an integer)

where Φ radians is the sum of phase change amounts to reflection of the light emitted from the light emitting layer at both interfaces bounding the gap and λ is the peak wavelength of the spectrum of green light extracted through said second electrode, and wherein an optical path length L of the cavity portion has a positive minimum value in a range that satisfies the equation below and m1 is the integer m that satisfies the equation below:

$(2L)/\lambda + \Phi/(2\pi) = m$ (m is an integer).

2. A display device comprising:
    a semi-transparent reflective layer;
    a first electrode of a light reflecting material;
    a second electrode of a transparent material; and
    an organic layer including a light emitting layer interposed between the first electrode and the second electrode,
    wherein,
    a cavity portion comprises one of a gap between an interface between the first electrode and said organic layer and an interface between the organic layer and said semi-transparent reflective layer, a gap between an interface between the semi-transparent reflective layer and the second electrode and an upper edge interface of the second electrode, and a gap between an interface between the first electrode and said organic layer and said upper edge interface of the second electrode,
    a color filter is provided for transmitting light resonating in said cavity portion and extracted through said second electrode, and
    a reflectance of each wavelength of external light is limited to 30% or less.

3. A display device of claim 2, wherein,
    an optical path length L of said cavity portion has a positive minimum value in a range that satisfies the equation:

$(2L)/\lambda + \Phi/(2\pi) = m$ (m is an integer)

where Φ radians is the sum of phase change amounts to reflection of the light emitted from the light emitting layer at both interfaces bounding the gap and λ is the peak wavelength of the spectrum extracted through said second electrode.

4. A display device of claim 2, wherein,
    an optical path length L' of said cavity portion satisfies the equation:

$(2L')/\lambda + \Phi/(2\pi) = m1 + 4$ (m is an integer)

where Φ radians is the sum of phase change amounts to reflection of the light emitted from the light emitting layer at both interfaces bounding the gap and λ is the peak wavelength of the spectrum of green light extracted through said second electrode, and m1 is the integer m that satisfies the equation:

$(2L)/\lambda + \Phi/(2\pi) = m$ (m is an integer).

5. A display device of claim 2, wherein,
    an optical path length L' of said cavity portion satisfies the equation:

$(2L')/\lambda + \Phi/(2\pi) = m1 + q$ (m is an integer)

where Φ radians is the sum of phase change amounts to reflection of the light emitted from the light emitting layer at both interfaces bounding the gap and λ is the peak wavelength of the spectrum of green light extracted through said second electrode, and m1 is the integer m that satisfies the equation and q is the integer not smaller than 10:

$(2L)/\lambda + \Phi/(2\pi) = m$ (m is an integer).

6. A display device comprising:
    a semi-transparent reflective layer;
    a first electrode of a light reflecting material;
    a second electrode of a transparent material;
    a passivation film on said second electrode; and
    an organic layer including a light emitting layer interposed between the first electrode and the second electrode, wherein,
a cavity portion comprises a gap between an interface between the semi-transparent reflective layer and the second electrode and an upper edge interface of said passivation film,
  wherein an optical path length L' of said cavity portion satisfies the equation:

$(2L')/\lambda + \Phi/(2\pi) = m1 + 4$ (m is an integer)

where $\Phi$ radians is the sum of phase change amounts to reflection of the light emitted from the light emitting layer at both interfaces bounding the gap and $\lambda$ is the peak wavelength of the spectrum of green light extracted through said second electrode, and wherein an optical path length L of the cavity portion has a positive minimum value in a range that satisfies the equation below and m1 is the integer m that satisfies the equation below:

$(2L)/\lambda + \Phi/(2\pi) = m$ (m is an integer).

7. A display device comprising:
a semi-transparent reflective layer;
a first electrode of a light reflecting material;
a second electrode of a transparent material;
a passivation film on said second electrode; and
an organic layer including a light emitting layer interposed between the first electrode and the second electrode,
wherein,
a cavity portion comprises a gap between an interface between the semi-transparent reflective layer and the second electrode and an upper edge interface of said passivation film,
  wherein an optical path length L' of said cavity portion satisfies the equation:

$(2L')/\lambda + \Phi/(2\pi) = m1 + q$ (m is an integer)

where $\Phi$ radians is the sum of phase change amounts to reflection of the light emitted from the light emitting layer at both interfaces bounding the gap and $\lambda$ is the peak wavelength of the spectrum of green light extracted through said second electrode, and wherein an optical path length L of said cavity portion has a positive minimum value in a range that satisfies the equation below and m1 is the integer m that satisfies the equation below and q is the integer not smaller than 10:

$(2L)/\lambda + \Phi/(2\pi) = m$ (m is an integer).

* * * * *